United States Patent [19]
Shealy et al.

[11] Patent Number: 6,043,519
[45] Date of Patent: Mar. 28, 2000

[54] JUNCTION HIGH ELECTRON MOBILITY TRANSISTOR-HETEROJUNCTION BIPOLAR TRANSISTOR (JHEMT-HBT) MONOLITHIC MICROWAVE INTEGRATED CIRCUIT (MMIC) AND SINGLE GROWTH METHOD OF FABRICATION

[75] Inventors: Jeffrey B. Shealy, Thousand Oaks; Mehran Matloubian, Encino, both of Calif.

[73] Assignee: Hughes Electronics Corporation, El Segundo, Calif.

[21] Appl. No.: 08/712,824

[22] Filed: Sep. 12, 1996

[51] Int. Cl.$^7$ ............... H01L 31/0328; H01L 31/0336; H01L 31/072; H01L 31/109
[52] U.S. Cl. .............. 257/195; 257/192; 257/194; 257/197; 257/198
[58] Field of Search ................. 257/192, 194, 257/195, 197, 198

[56] References Cited

U.S. PATENT DOCUMENTS

| | | | |
|---|---|---|---|
| 4,821,090 | 4/1989 | Yokoyama | 257/192 |
| 5,223,449 | 6/1993 | Morris et al. | 437/51 |
| 5,293,084 | 3/1994 | Itoh et al. | 257/195 |

FOREIGN PATENT DOCUMENTS

| | | | |
|---|---|---|---|
| 3-64963 | 3/1991 | Japan | 257/195 |

OTHER PUBLICATIONS

"Junction heterostructures for high performance electronics", by Shealy et al., Solid State Electronics, vol. 38, No. 9, pp. 1607–1610, Sep. 1, 1995.

"Integration of GaInP/GaAs heterojunction bipolar transistors and high electron mobility transistors", by Yang et al., IEEE Electron Device Letters, vol. 17, No. 7., pp. 363–365, Jul. 1, 1996.

Usagawa et al., "A New Two–Dimensional Electron Gas Base Transistor (2DEG–HBT)," IEDM, pp. 78–81, 1987.

Zampardi et al., "Circuit Demonstrations in a GaAs BiFET Technology," Solid–State Electronics, Solid–State Electronics, vol. 38, No. 9, pp. 1723–1726, 1995.

Streit et al., "Monolithic HEMT–HBT Integration by Selective MBE," IEEE Transactions on Electron Devices, Vo. 42, No. 4, pp. 618–623, Apr., 1995.

*Primary Examiner*—Steven H. Loke
*Attorney, Agent, or Firm*—V. D. Duraiswamy; M. W. Sales

[57] ABSTRACT

A highly uniform, planar and high speed JHEMT-HBT MMIC is fabricated using a single growth process. A multi-layer structure including a composite emitter-channel layer, a base-gate layer and a collector layer is grown on a substrate. The composite emitter-channel layer includes a sub-emitter/channel layer that reduces the access resistance to the HBT's emitter and the JHEMT's channel, thereby improving the HBT's high frequency performance and increasing the JHEMT's current gain. The multi-layer structure is then patterned and metallized to form an HBT collector contact, planar HBT base and JHEMT gate contacts, and planar HBT emitter and JHEMT source and drain contacts.

11 Claims, 7 Drawing Sheets

JUNCTION HIGH ELECTRON MOBILITY TRANSISTOR-HETEROJUNCTION BIPOLAR TRANSISTOR (JHEMT-HBT) MONOLITHIC MICROWAVE INTEGRATED CIRCUIT (MMIC) AND SINGLE GROWTH METHOD OF FABRICATION

BACKGROUND OF THE INVENTION

1. Field of the Invention

This invention relates to mixed-signal device fabrication technology and more specifically to a JHEMT-HBT MMIC and method of fabrication that requires only a single growth process.

2. Description of the Related Art

Mixed-signal devices take advantage of the different characteristics of field effect transistors and bipolar transistors to achieve circuit functions and performance levels not currently available using existing single-device technologies. HEMTs have very low noise and high current gain characteristics which make them well suited for detecting faint signals. However, HEMTS are highly non-linear, and thus cannot operate over a large dynamic range. HBTs are relatively noisy but highly linear, and thus well suited for the amplification of large signals. As a result, the two complementary devices can be combined to form a low noise amplifier (LNA), with the HEMT providing the front end receiver and the HBT providing a high linearity output stage. Furthermore, known analog or digital bipolar circuit configurations can be used to control a HEMT amplifier. For example, an HBT circuit can be used to regulate the current in the HEMT amplifier.

One known approach is to fabricate separate HEMT and HBT MMICs that perform the respective amplification and biasing functions, bond them to a carrier and then interconnect their pins using conventional wire bonding techniques to produce the desired mixed-signal circuit configuration. The advantage of this approach is that the fabrication of the single-device MMICs is well known. However, the mixed-signal circuit is not an integrated circuit, and thus does not have the cost and performance advantages of an IC. Wire bonding separate MMICs is labor intensive and thus expensive, requires large device-to-device spacing which reduces the device density per wafer, and adds resistance to the circuit which has the effect of lowering its speed.

Streit et al, "Monolithic HEMT-HBT Integration by Selective MBE," IEEE Transactions on Electron Devices, Vol 42, No. 4, pp. 618–623, April, 1995 discloses a selective growth process for integrating a Schottky-gate HEMT and an HBT in a MMIC. First, a Gallium-Arsenide (GaAs) substrate is placed in a chamber and a multi-layer npn-HBT structure is grown on the substrate using a molecular beam epitaxy (MBE) process. The substrate is removed from the chamber and patterned to roughly define the HBT device. The patterning process includes depositing a layer of silicon nitride on the HBT structure, depositing a mask over the silicon nitride and plasma etching the exposed silicon nitride with chlorine-fluoride gas to selectively remove the silicon nitride and define the HBT device. The silicon nitride patterning process is expensive and time consuming.

The substrate is then put back into the chamber for a second MBE regrowth to produce the multi-layer HEMT structure, followed by etching the substrate with hydrofluoric acid to remove the remaining silicon nitride from the HBT structure. The compositions of the multi-layer HBT and HEMT structures are selected to optimize their respective performances. Thus, the materials and thickness of the individual layers are not the same. Once both the HBT and HEMT structures are formed, they are patterned and metallized using conventional etching and deposition processes, respectively, to define the devices active areas and metal contacts. This includes a gate-recess etch through the HEMT structures to define their Schottky barriers. The gate-recess etch is difficult to control, and thus reduces the HEMT uniformity across the wafer.

Although Streit's HEMT-HBT is integrated, and thus realizes the advantages of integrated circuits, it has a number of serious deficiencies. The growth and regrowth of the HBT and HEMT structures increases fabrication time which increases the cost of the MMIC. When the substrate is removed from the chamber between growths for processing it can become contaminated, which reduces the quality of the HEMT material grown in the regrowth stage. Furthermore, during regrowth the HEMT material tends to build up along the edge adjacent the HBT structure. As a result, the periphery of the HEMT can be of poor quality and unusable as part of the HEMT's active area. This increases the spacing between the devices, which reduces the number of devices that can be fabricated on a wafer. The regrowth process also exposes the device to temperatures in excess of 600° C., which causes dopants in the highly doped base region to diffuse into the emitter and collector regions, thereby reducing the abruptness of the pn junctions and lowering the HBT's current gain.

Streit's growth and regrowth process produces HEMT and HBT devices that are non-planar, i.e., they have large step discontinuities between adjacent devices. This occurs because the two devices are fabricated in independent growths, and thus cannot be exactly matched, have different multi-layer structures to optimize their respective performances, and the HEMT structure builds up near the edge of the HBT during regrowth. As a result, the potential for breaks in the metal interconnections formed through conventional deposition processes is high. This reduces the reliability of the HEMT-HBT device. Furthermore, thicker metal interconnections are required to reduce the chance of breakage due to the step discontinuities, which increases the weight of the device.

Zampardi et al, "Circuit Demonstrations in a GaAs BiFET Technology," Solid-State Electronics, Vol. 38, No. 9, pp. 1723–1726, 1995 disclose a Schottky-gate MESFET-HBT integrated circuit. The MESFET and HBT share only a single layer; the MESFET's channel and the HBT's emitter. In order to provide the necessary HBT emitter characteristics, Zampardi uses GaAs, which provides lower channel mobility than that achievable in a HEMT.

Usagawa et al., "A New Two-Dimensional Electron Gas Base Transistor (2DEG-HBT)," IEDM, pp. 78–81, 1987 discloses an integrated pnp-HBT HEMT device in which the devices share a single layer; the HEMT's channel and the pnp-HBT's base. The shared layer includes a two dimensional electron gas (2DEG) that is necessary to provide the high electron mobility in the HEMT. The 2DEG is very thin, and thus the HBT's base is susceptible to punch through when heavily reverse biased. This can destroy the HBT's bipolar operation. Furthermore, the pnp-HBT is very slow due to the low mobility of holes with respect to that of electrons.

SUMMARY OF THE INVENTION

In view of the above problems, the present invention provides a single growth process for fabricating a highly uniform, planar and high speed JHEMT-HBT MMIC.

This is accomplished by growing a multi-layer semiconductor structure in a single growth such as an MBE process. The multi-layer structure includes a composite channel-emitter layer, a base-gate layer and a collector layer. The channel-emitter layer comprises an emitter/channel layer in which the HBT's emitter region and the JHEMT's channel are formed, a sub-channel/emitter layer on one side of the emitter/channel layer that is doped to reduce the access resistance to the emitter region and the channel, and a composite modulation layer on the other side of the emitter/channel layer that is doped to form a heterojunction at the JHEMT's channel.

The multi-layer structure is patterned and metallized to form a collector pedestal that supports an HBT metal collector contact. Thereafter, the base-gate layer is patterned to a) form an HBT base mesa that supports an HBT metal base contact adjacent to the HBT metal collector contact and which extends below the collector pedestal, and to b) form a JHEMT gate pedestal which supports a JHEMT metal gate contact that is spaced apart from the HBT collector contact. An HBT emitter contact is formed on the composite channel-emitter layer adjacent the HBT base contact, and the JHEMT source and drain contacts are formed on the composite channel-emitter layer on opposite sides of the JHEMT gate contact. The HBT emitter and JHEMT source and drain contacts are activated to infuse them into the composite channel-emitter layer such that the HBT emitter contact defines the emitter region and the JHEMT source and drain contacts define the channel.

These and other features and advantages of the invention will be apparent to those skilled in the art from the following detailed description of preferred embodiments, taken together with the accompanying drawings, in which:

DETAILED DESCRIPTION OF THE INVENTION

The present invention discloses a single growth process for fabricating a JHEMT-HBT MMIC, in which the JHEMT and HBT devices share two layers; the JHEMT gate/HBT base layer and the JHEMT channel/HBT emitter layer. This improves the planarity of the mixed-signal MMIC, which increases the reliability of the metal interconnects formed by overlay deposition. Furthermore, the uniformity between devices on a wafer depends only upon the growth uniformity and not on the subsequent patterning. The MMIC features a collector up HBT structure which exhibits a low collector-base capacitance and thus has a higher operating frequency than known emitter up HBTs. It also includes a composite emitter-channel structure that provides low emitter resistance and low channel access resistance required for high frequency operation.

Another aspect of the invention is that the multi-layer structure is designed so that the performance of one device is not traded off against the performance of the other. Their functions in a given layer are consistent, and thus selecting a material or a dopant level to improve certain properties in one device is consistent with improving the other device. For example, the selection of the material for the barrier layer provides a large valence band barrier that reduces hole injection into the JHEMT's channel and improves the HBT's emitter efficiency.

Figure 1:
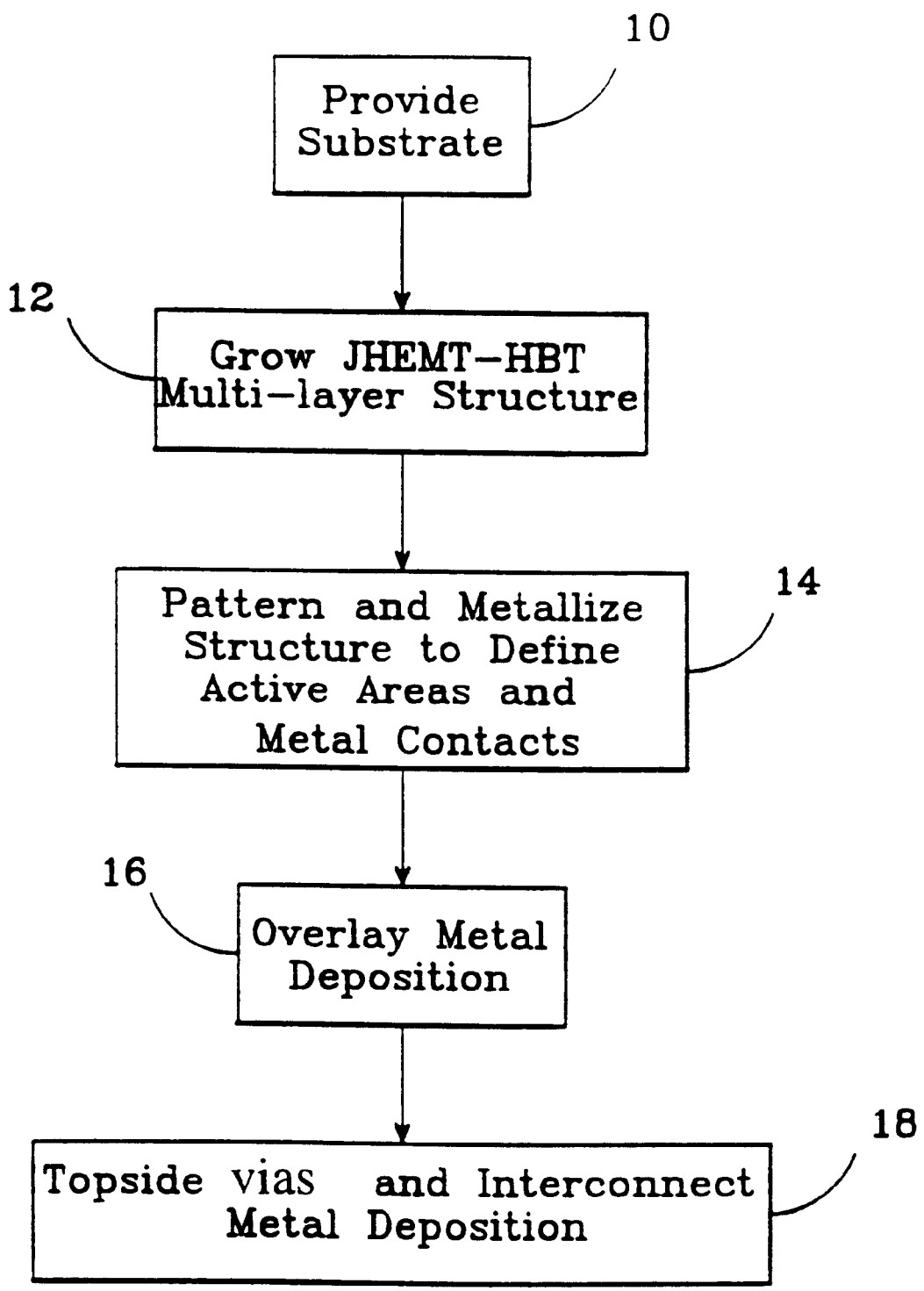
FIG. 1 is a flowchart of a single growth fabrication of a JHEMT-HBT MMIC in accordance with the present invention.

As illustrated in FIG. 1, the JHEMT-HBT MMIC is fabricated by placing a substrate in a growth chamber (step 10) and, in a single growth, forming the entire multi-layer JHEMT-HBT structure on the substrate (step 12). The multi-layer structure includes a composite channel-emitter layer, a base-gate layer and a collector layer. The structure also preferably includes a buffer layer for smoothing the surface of the substrate, an etch stop and channel cap layer for facilitating the selective undercutting of the HBT's base and reducing the access resistance to the HBT's emitter contact and the JHEMT's source and drain contacts, and a contact layer for reducing the access resistance between the collector and its metal contact. An MBE growth process is typically used to provide the best growth uniformity. However, MBE provides a relatively slow growth and is therefore expensive. Depending upon the application, it may be more efficient to use deposition processes such as metal organic chemical vapor deposition (MOCVD) or an organic metal vapor phase epitaxy (OMVPE), which are faster but less uniform. The single growth process avoids the contamination and the high temperature reexposure that are associated with a re-growth and degrade the performance of known MMICs.

Once the multi-layer structure is grown, the substrate is removed from the growth chamber and patterned/metallized to define the JHEMT's and HBT's active areas and metal contacts (step 14). As a result, the JHEMT and HBT are spaced closely together, with a gap of approximately 10 $\mu$m between them, without edge degradation. Furthermore, the HBT's emitter and JHEMT's source and drain contacts are replanar and the HBT's base and JHEMT's gate contact are replanar. This has the effect of improving the reliability of an overlay metal deposition (step 16) which follow the pattern/metallization. Thereafter, topside vias and interconnect metal deposition are formed using conventional techniques (step 18).

Figure 2:
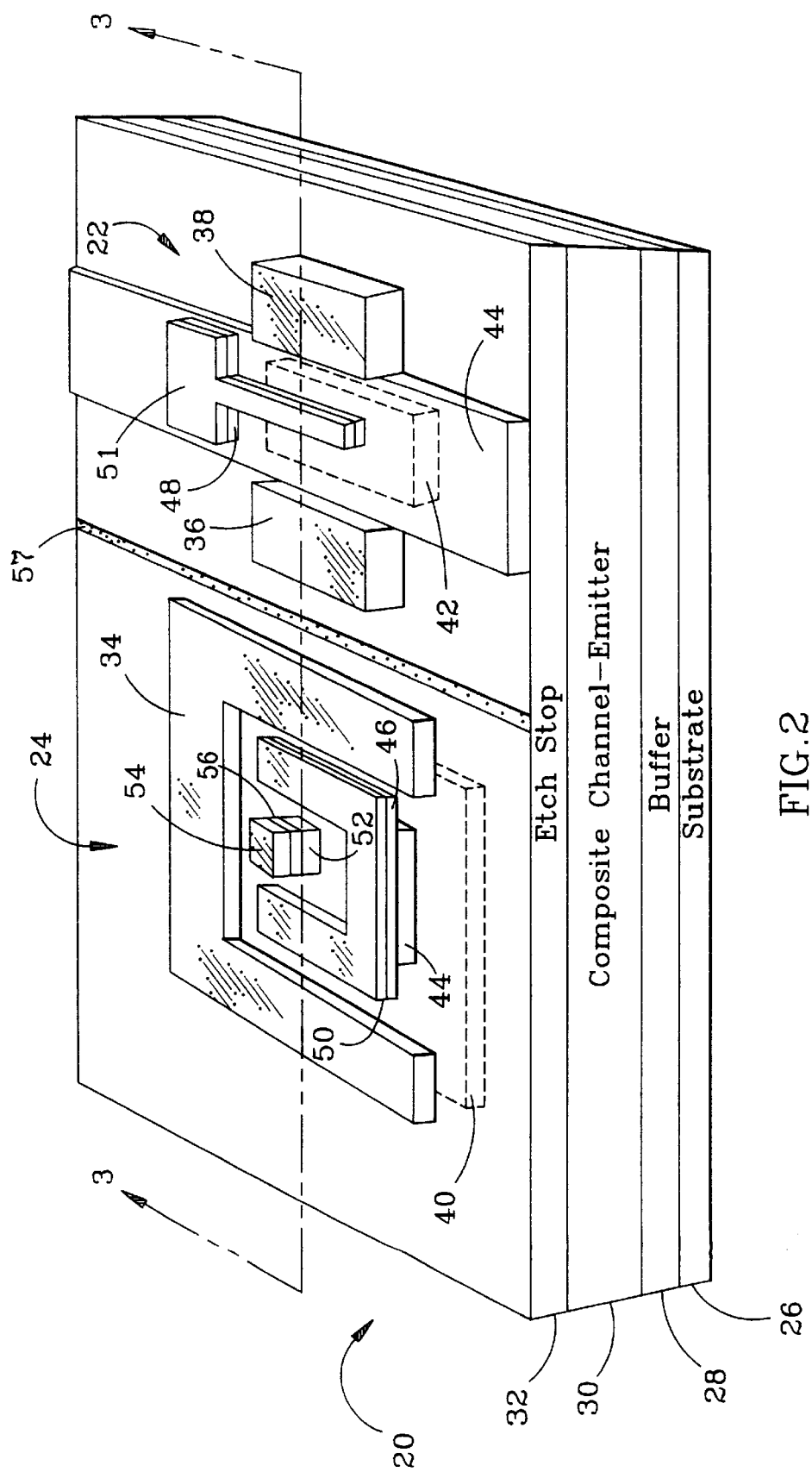
FIG. 2 is a perspective view of a preferred JHEMT-HBT MMIC produced by the single growth fabrication.

A portion of a JHEMT-HBT MMIC 20 showing a single pair of JHEMT and HBT devices 22 and 24, respectively, fabricated in accordance with the single growth process described in general in FIG. 1 and in more detail in FIGS. 3a through 3g, is shown in FIG. 2. The MMIC 20 includes a substrate 26 and preferably a buffer layer 28 for smoothing the surface of the substrate. A composite channel-emitter layer 30 on the buffer layer 28 serves as the active channel and emitter areas for the JHEMT and HBT, respectively. An etch stop layer 32 on the composite channel-emitter layer 30 provides low access resistance to the HBT's emitter contact 34 and the JHEMT's source and drain contacts 36 and 38, respectively. The emitter contact 34 and the source and drain contacts 36 and 38 are interfused into the composite channel-emitter layer 30 to define an emitter region 40 and a channel 42, respectively.

A patterned channel cap layer 44 on the etch stop layer 32 supports an HBT base mesa 46 above the emitter region 40 and also a JHEMT gate pedestal 48 above the channel 42, which respectively support an HBT base contact 50 and a JHEMT gate contact 51. The JHEMT's pn junction pedestal gate provides better dc and rf uniformity than the well known Schottky gate HEMT. The channel cap layer 44 is undercut to cut off the path for free electrons from the emitter region 40 to the HBT base contact 50 to improve emitter injection efficiency. Alternately, the channel cap and etch stop layers can be omitted and the path between the base contact 50 and the emitter region 40 cut off by ion implantation of the portion of the base mesa 46 below the base contact 50. A collector pedestal 52 on the base mesa 46 supports an HBT collector contact 54. A low resistance contact cap 56 preferably separates the collector pedestal 52 and contact 54 to reduce the access resistance to the contact collector 54.

The emitter region 40, base mesa 46 and collector pedestal 52 together define the collector up vertical HBT 24, in which under forward bias of its base-emitter junction, high mobility electrons are injected from the emitter region 40, drift through the base, and are collected at the collector electrode 54 due to the field established by the collector voltage. The channel 42 and gate pedestal 48 define the horizontal JHEMT 22, in which electrons are swept through the channel from the source contact 36 to the drain contact 38 in response to a gate voltage applied to the gate contact 51 that modulates the channel 42. The two devices are electrically isolated and physically separated by approximately 10 m by an implant isolation 57.

Figure 6:
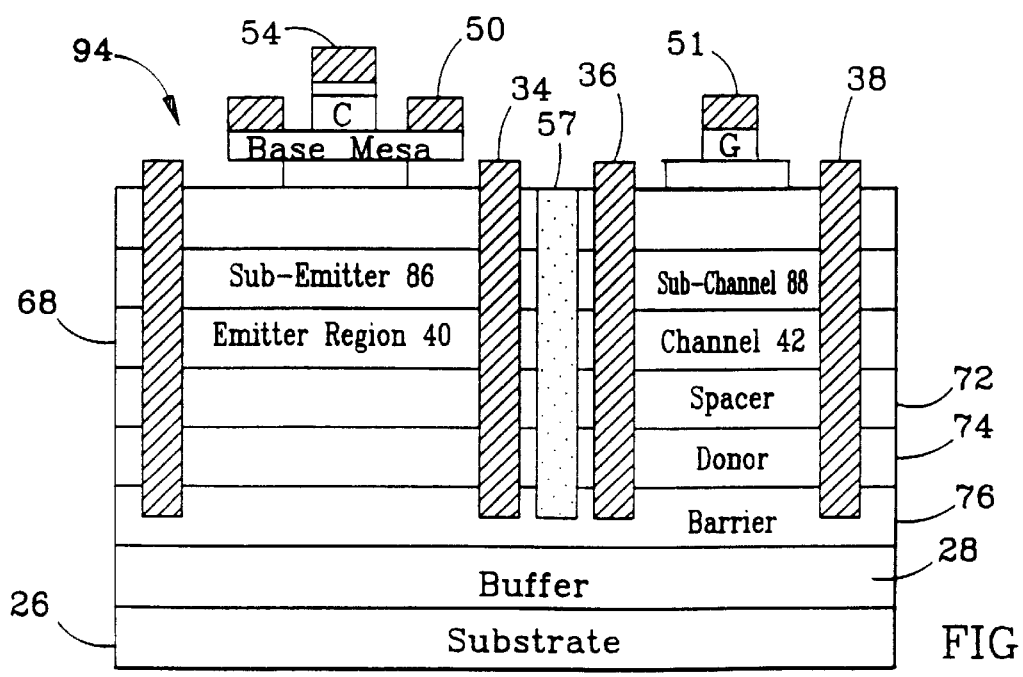
FIG. 6 is a sectional view of an alternative inverted JHEMT-HBT MMIC.

FIGS. 3a through 3g illustrate the fabrication of a preferred non-inverted n-channel JHEMT npn-HBT MMIC 20. As shown in FIG. 6 the MMIC can also be fabricated with an inverted JHEMT, which lowers the turn-on voltage of the HBT. The MMIC could also be fabricated as a p-channel JHEMT pnp-HBT device. However, this is not currently preferred because the mobility of holes is substantially lower than that of electrons.

Figure 3A:
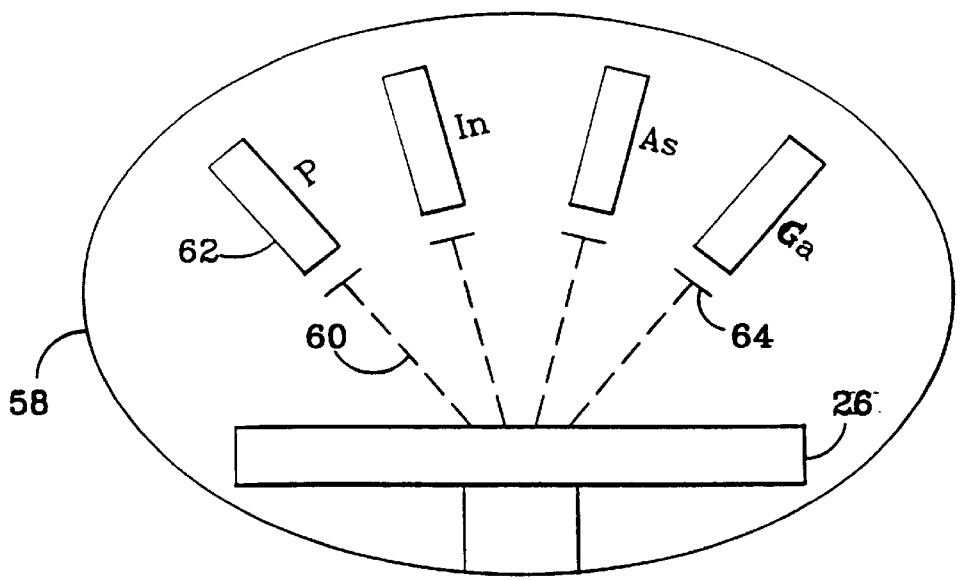
FIGS. 3a through 3g illustrate successive steps in the fabrication process as seen along section line 3—3 in FIG. 2.

As shown in FIG. 3a, an undoped insulating GaAs substrate 26 having a thickness of 400–600 μm is placed in an MBE chamber 58 under an ultrahigh (deep) vacuum. The substrate 26 is heated and bombarded by ion beams 60 produced by gallium (Ga), arsenide (As), indium (In) and phosphide (P) ion sources 62 to form a high-quality semiconductor film on the substrate. Closing or opening shutters 64 controls the film composition and/or doping levels to within one atomic distance.

Figure 3B:
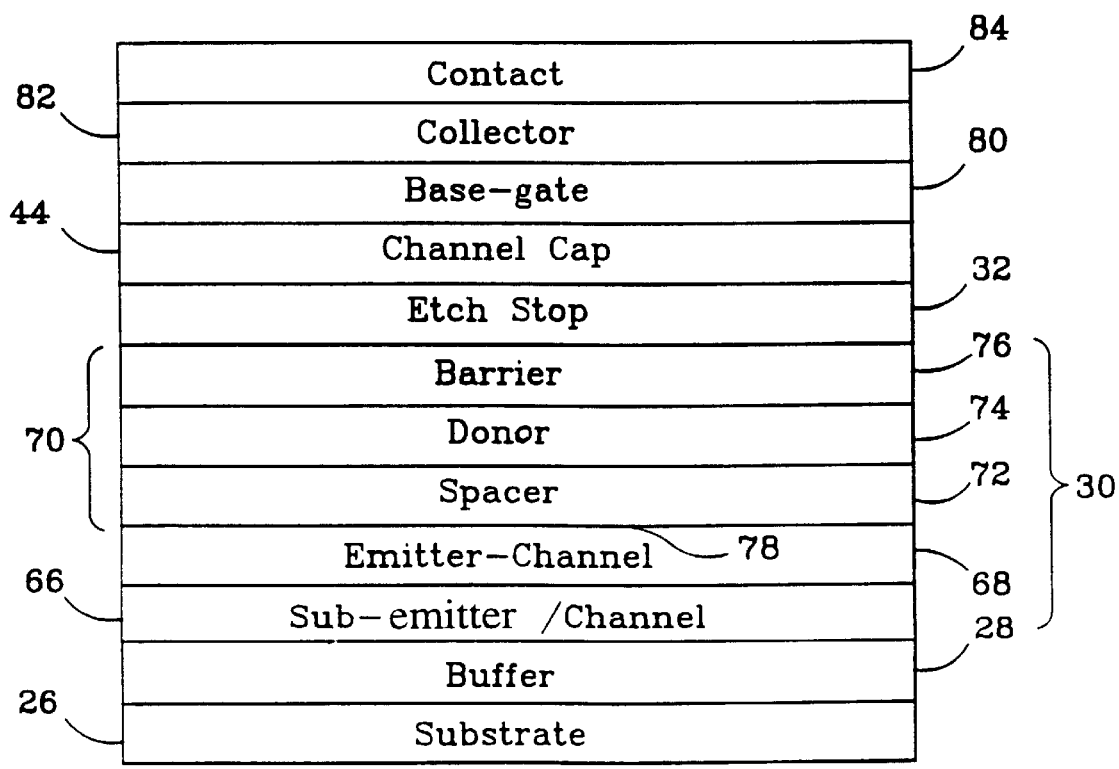

Because the surface of the substrate 26 is relatively rough, the buffer layer 28 is grown to provide a smooth surface as shown in FIG. 3b. The buffer layer is suitably an undoped large band gap material with high resistance and is grown to a thickness of 1 Å to 1 μm. Thereafter, the composite channel-emitter layer 30 is grown on the buffer layer 28. First, an n-type GaAs sub-emitter/channel layer 66 is grown to a thickness of 50–500 Å with a dopant level of $1 \times 10^{17}$ to $5 \times 10^{18}$ impurity atoms/cm$^3$. The sub-emitter/channel layer 66 provides low channel resistance, less than 1000Ω per square, a high electron concentration for the JHEMT and a low emitter access resistance for the HBT. Second, an intrinsic InGaAs emitter-channel layer 68 is grown to a thickness of 50–500 Å to provide high electron mobility, a low band gap voltage (0.35–1.1 ev), and low effective electron mass. Third, a composite modulation layer 70 is grown on the emitter-channel layer 68.

The composite modulation layer 70 includes an intrinsic GaInP spacer layer 72 on the emitter-channel layer 68 with a thickness of 10–100 Å, an n-type GaInP donor layer 74, and an intrinsic to slightly n-type (greater than $5 \times 10^{17}$ atoms/cm$^3$) GaInP barrier layer 76. (When an inverted JHEMT-HBT is fabricated, the sequence of growth steps for the composite emitter-channel layer 30 is reversed so that the barrier layer is grown on the substrate and the sub-emitter-channel layer is on top.)

The donor layer 74 is grown with a sheet thickness of 1 Å to 100 Å and is typically specified by the product of its thickness and the number of donor atoms/cm$^3$, suitably between $1 \times 10^{12}$ and $3 \times 10^{12}$ atoms/cm$^2$. The donor layer 74 supplies high mobility free electrons to the emitter-channel layer 68, leaving ionized impurity atoms in the donor layer. The spacer layer 72 isolates the free electrons in the channel from their ionized impurity atoms, thereby reducing ionized impurity scattering. The barrier layer 76 has a relatively high band gap voltage (1.1–2.5 ev) that creates a heterojunction 78 at the interface between the composite modulation layer 70 and the emitter-channel layer 68. The material and dopant levels of the barrier layer are selected to provide both a large conduction band discontinuity that constrains the free electrons to the channel, and a large valence band barrier that limits hole injection into the channel. The composition of the barrier layer 76 is also consistent with providing the HBT 24 with a high emitter efficiency.

The n-type GaAs etch stop layer 32 is preferably grown on the barrier layer 76 to a thickness of 40–100 Å with a dopant level between $5 \times 10^{17}$ and $5 \times 10^{18}$ atoms/cm$^3$. The etch stop layer 32 provides low access resistance to the emitter, source and drain contacts shown in FIG. 2 and facilitates selective removal of the channel cap layer 44. The channel cap layer is suitably 40–100 Å of n-type GaInP with a dopant level of $5 \times 10^{17}$ and $5 \times 10^{18}$ atoms/cm$^3$ and may be selectively undercut as shown in FIG. 2 to improve emitter injection efficiency.

A p$^+$-type GaAs base-gate layer 80 is grown on the channel cap with a high dopant level of $1 \times 10^{19}$ to $1 \times 10^{21}$ to provide the desired base-to-emitter properties and a low access resistance to the base and gate contacts 50 and 51 shown in FIG. 2. The base-gate layer is preferably as thin as possible (200–1000 Å) to increase speed, yet thick enough to prevent punch through. An n-type GaInP collector layer 82 having a thickness 50 Å to 1 μm with dopant levels of $5 \times 10^{17}$ and $5 \times 10^{19}$ atoms/cm$^3$ is grown on the base-gate layer 80. The collector layer is selected so that it can be removed from the base-gate layer and can withstand high electric fields. Alternately, the collector layer can be formed with a relatively thick GaAs layer and a thin GaInP that facilitates removal from the base-gate layer 80. Lastly, a 100 Å to 1 μm n$^+$-type contact layer 84 with a dopant level in excess of $5 \times 10^{18}$ atoms/cm$^3$ is preferably formed on the collector layer 82 to reduce the access resistance to the collector contact 54 shown in FIG. 2.

Once the JHEMT-HBT structure has been grown, the substrate is removed from the chamber and patterned/metallized to define the devices' active areas and metal contacts shown in FIG. 2. The preferred approach is to pattern the metal contacts and then use them to etch the underlying layer to define the active area. Alternately, conventional photolithographic techniques can be used to first pattern the active areas and then deposit the metal contacts. The preferred approach requires fewer processing steps and produces metal contacts and active areas that are self-aligned. The alternate approach would allow the collector and base contacts to be deposited at the same time.

Figure 3C:
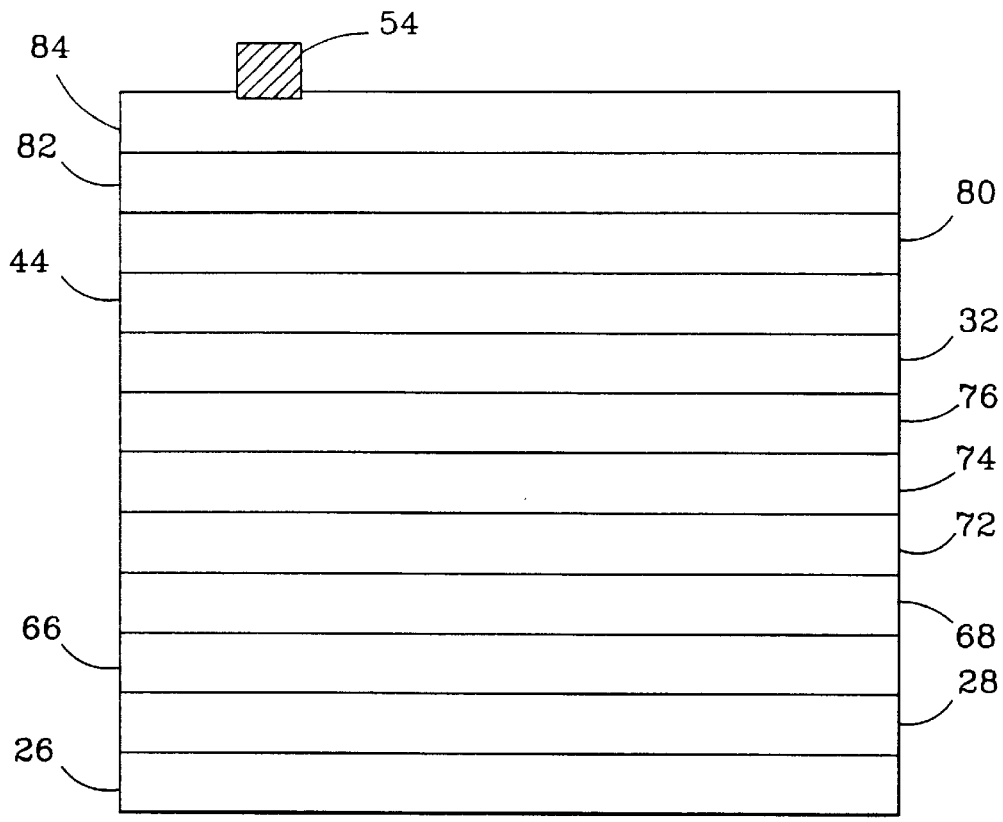

In accordance with the preferred fabrication, the collector contact 54 is formed on the surface of contact layer 84 as shown in FIG. 3c. This is preferably accomplished by forming a polymer layer over the contact layer, exposing it to radiation and developing it to remove the polymer material where the collector contact is to be formed. Metal is then evaporated over the polymer layer to form the contact 54 and the polymer is lifted off.

Figure 3D:
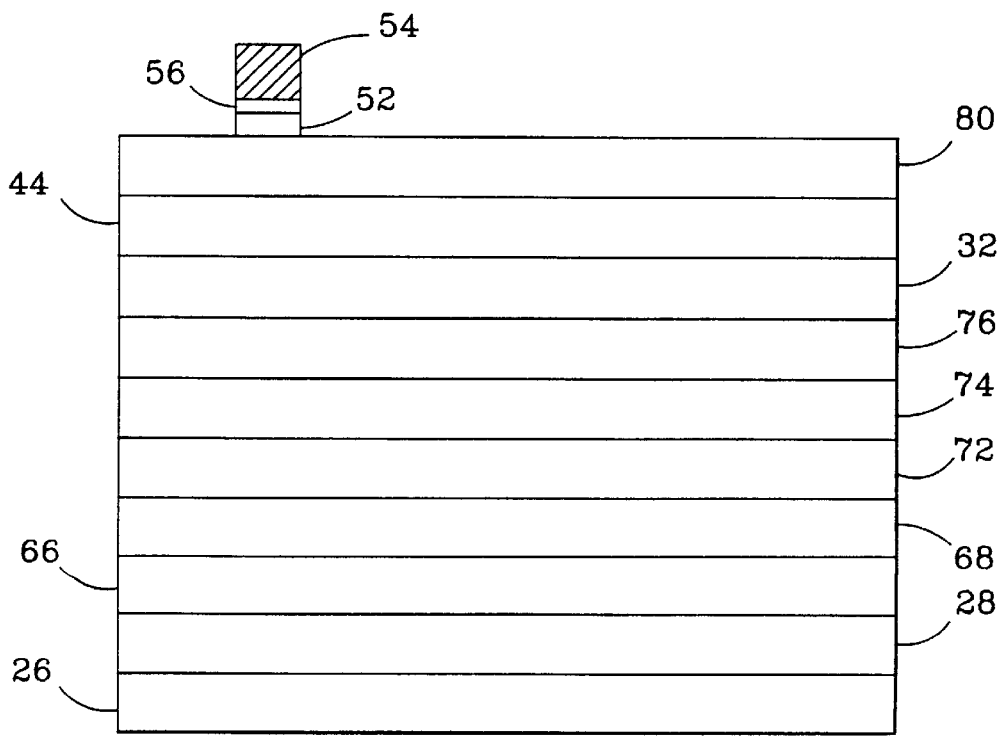
Figure 3E:
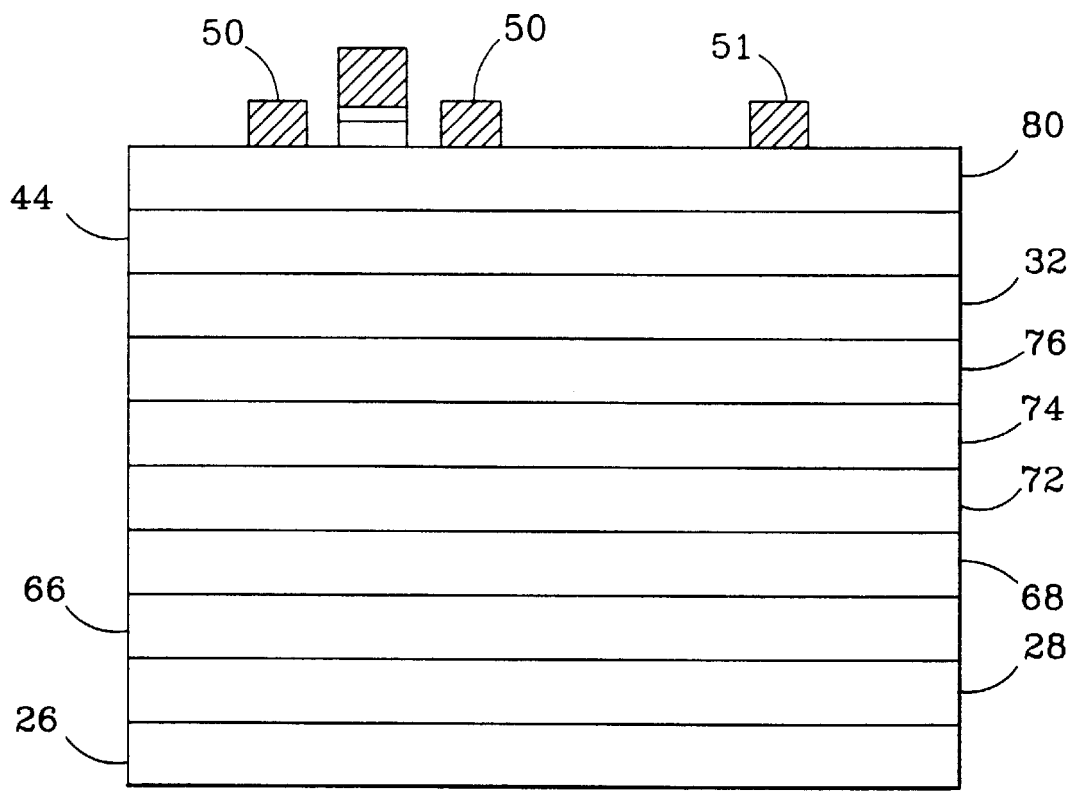
Figure 3F:
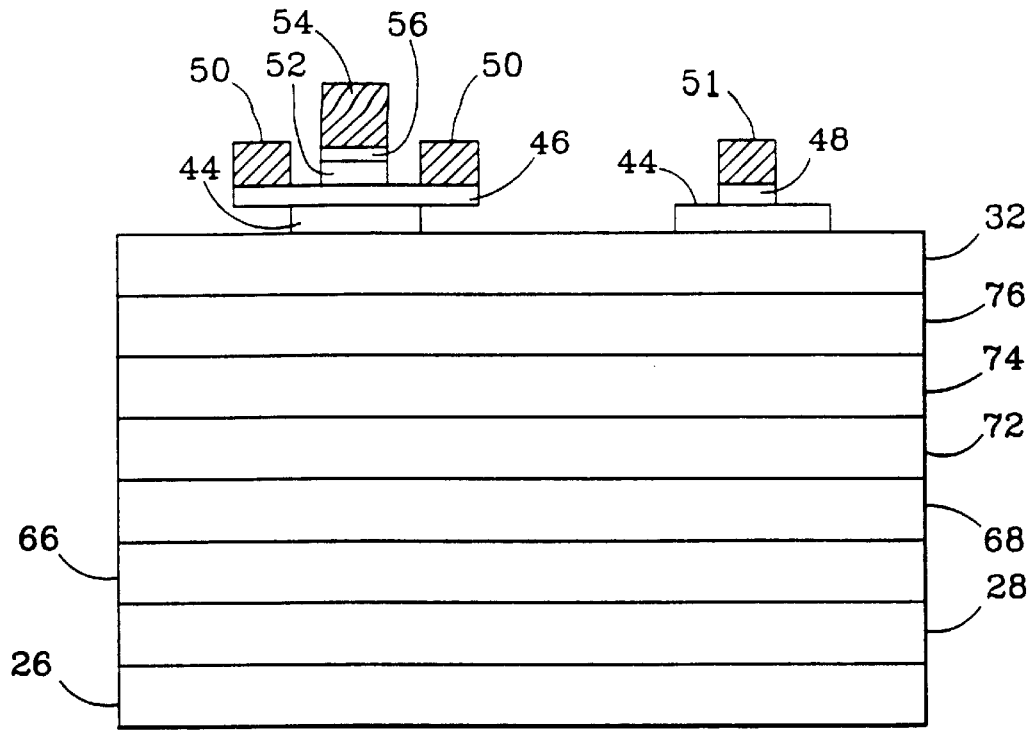

As shown in FIG. 3d, the collector contact 54 has been used as a mask to acid etch and selectively remove the exposed portion of the contact layer 84 and the underlying collector layer 82. Using the same process that was used to form the collector contact 54, the base contact 50 and gate contact 51 are formed on the base-gate layer 80 as shown in FIG. 3e. Thereafter, the base-gate layer 80 is patterned to define the base mesa 46 and gate pedestal 48. As shown in FIG. 3f, the base mesa is selectively undercut by etching away the cap layer 44 to cut off the path between the base contact 52 and the emitter region.

Figure 3G:
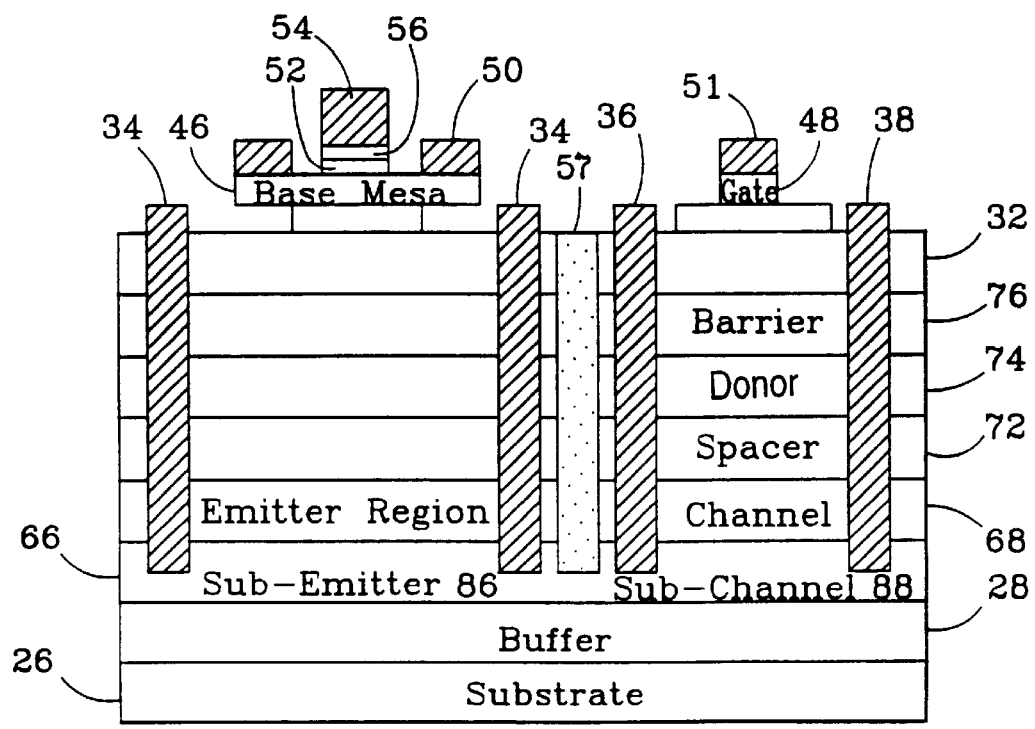

As shown in FIG. 3g, the HBT emitter contact 34 and JHEMT source and drain contacts 36 and 38 are deposited on the etch stop layer 32 and activated to interfuse them into the sub-emitter/channel layer 66. The HBT emitter contact 34 defines the emitter region 40 and a sub-emitter 86 that reduces the access resistance between the emitter region and the emitter contact, thereby increasing the maximum operating frequency of the HBT. The JHEMT source and drain contacts 36 and 38 define the channel 42 and a sub-channel 88 that reduces the access resistance between the channel and the source and drain contacts, thereby increasing the JHEMT's current gain. The two devices are electrically isolated and physically separated by approximately 10 $\mu$m by an implant isolation 57.

Figure 4:
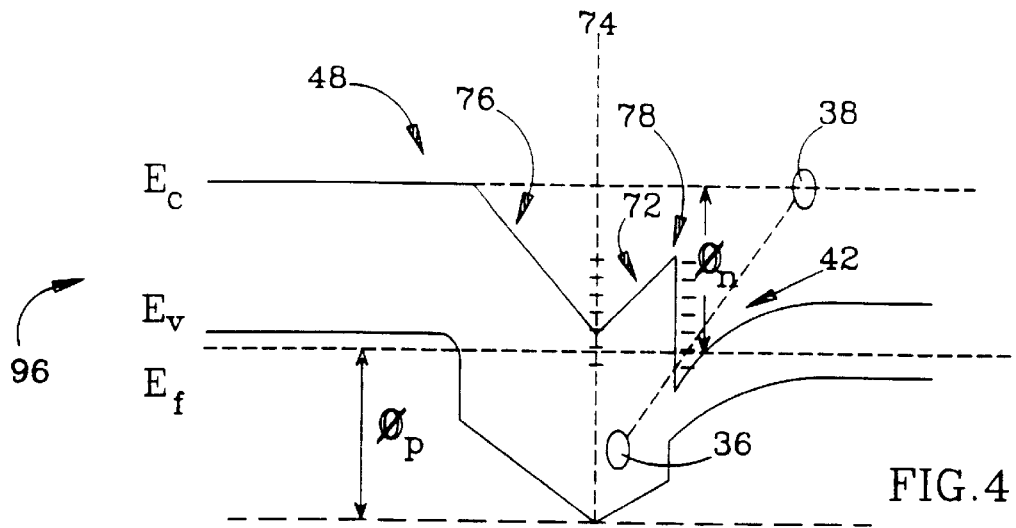
FIG. 4 is a band gap energy diagram for a JHEMT produced by the fabrication process shown in FIGS. 3a through 3g.

FIG. 4 illustrates the band gap energy diagram 90 for the horizontal JHEMT under equilibrium conditions. The energy diagram shows the discontinuities in both the conduction band $E_c$ and valence band $E_v$ at the heterojunction 78.

The donor layer 74 supplies free electrons that produce a 2DEG in the channel 42. The spacer layer 72 separates the free electrons in the 2DEG from ionized impurity atoms that remain in the donor layer 74. The barrier layer 76 is selected and doped so that the hole barrier potential $\phi_p$ is greater than the electron barrier potential $\phi_n$ and, as a result, the hole injection into the channel 42 is low. In the gate pedestal 48 the valence band energy $E_v$ is slightly above the fermi energy $E_f$ and the conduction band energy $E_c$ is approximately 1.1–2.5 ev higher. The JHEMT's channel 42 is modulated by the potential applied at the gate contact 51. This regulates the flow of the free electrons between the source and drain contacts 36 and 38, respectively, along a horizontal axis into the plane of the paper.

Figure 5:
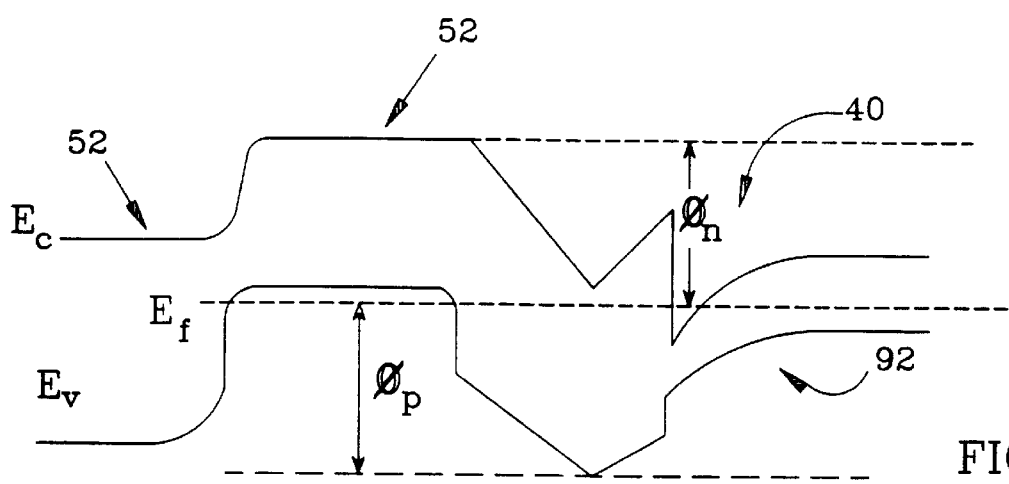
FIG. 5 is a band gap energy diagram for a HBT produced by the fabrication process shown in FIGS. 3a through 3g.

FIG. 5 illustrates the band gap energy diagram 92 for the vertical npn-HBT under equilibrium. The pn base-emitter junction of the HBT shares the same requirements as the pn gate-channel junction of the JHEMT shown in FIG. 4. The conduction and valence bands $E_c$ and $E_v$ of the n-type collector pedestal 52 and emitter region 40 are lower than those of the p$^+$-type base pedestal 52. Because the electron barrier potential $\phi_n$ is greater than the hole barrier potential $\phi_p$, the HBT has high emitter injection efficiency. Under forward bias, the HBT is controlled by modulating the base potential to regulate the conductivity between the collector pedestal 52 and emitter region 40 to produce a voltage gain across their contacts.

FIG. 6 is a sectional view of an inverted JHEMT-HBT 94. The inverted device is formed using the same single growth fabrication discussed in relation to FIGS. 3a through 3g except that the sequence of growing the composite emitter-channel layer is reversed. As a result, the barrier 76, donor 74, and spacer 72 layers are grown between the buffer layer 28 and the emitter-channel layer 68, and the sub-emitter/channel layer 66 is grown on top of the emitter-channel layer 68.

Figure 7:
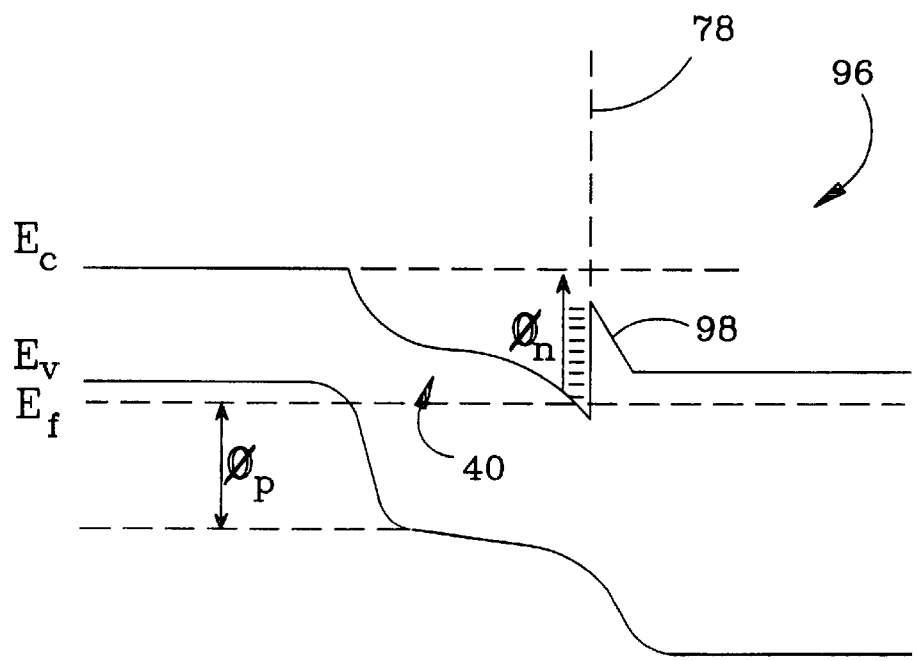
FIG. 7 is a band gap energy diagram for the inverted JHEMT shown in FIG. 6.

As shown in FIG. 7, the energy band characteristics for the inverted JHEMT-HBT are flipped around the heterojunction 78 in the band gap energy diagram 96. This reduces the HBT's base-emitter turn-on voltage by moving the energy spike 98 at the heterojunction outside the HBT emitter region 40. The performance of the inverted JHEMT is only slightly degraded when compared to the non-inverted JHEMT.

While several illustrative embodiments of the invention have been shown and described, numerous variations and alternate embodiments will occur to those skilled in the art. For example, an InP substrate can be used instead of a GaAs substrate. The multi-layer structure would be the same except that the GaInP materials are replaced with InP and the GaAs materials are replaced with GaInAs. Other combinations of materials and dopant levels may be used in the single growth fabrication process to produce the JHEMT-HBT MMIC. Such variations and alternate embodiments are contemplated, and can be made without departing from the spirit and scope of the invention as defined in the appended claims.

We claim:

1. A Junction High Electron Mobility Transistor-Heterojunction Bipolar Transistor (JHEMT-HBT) monolithic microwave integrated circuit (MMIC), comprising:

a substrate;

an emitter-channel layer over said substrate;

an implant through said emitter-channel layer that defines and isolates coplanar HBT emitter region and JHEMT channel;

coplanar emitter contact and source and drain contacts, said emitter contact interfused into said emitter region and said source and drain contacts interfused into said channel;

a composite modulation layer configured and positioned to form a heterojunction with said emitter-channel layer and to supply high mobility free electrons to said channel;

a base-gate layer positioned above said emitter-channel layer, said base-gate layer patterned to form coplanar HBT base mesa and JHEMT gate pedestal that are respectively arranged over said emitter region and said channel;

coplanar base and gate contacts on a first portion of said base mesa and on said gate pedestal, respectively;

an HBT collector pedestal on a second portion of said base mesa; and a collector contact on said collector pedestal, said HBT emitter region, base mesa and collector pedestal forming a collector up vertical HBT and said JHEMT channel and gate pedestal forming a horizontal JHEMT.

2. The JHEMT-HBT MMIC of claim 1, further including a sub-channel/emitter layer abutting said emitter-channel layer and doped to reduce the channel resistance and the access resistance to said emitter region.

3. The JHEMT-HBT MMIC of claim 2, further comprising a contact cap on the collector pedestal that reduces access resistance to said collector contact.

4. The JHEMT-HBT MMIC of claim 1, wherein said composite modulation layer is between said emitter-channel layer and said base-gate layer.

5. The JHEMT-HBT MMIC of claim 1, wherein said composite modulation layer is between said substrate and said emitter-channel layer.

6. A Junction High Electron Mobility Transistor-Heterojunction Bipolar Transistor (JHEMT-HBT) monolithic microwave integrated circuit(MMIC), comprising:

a substrate;

a composite channel-emitter layer on said substrate, said channel-emitter layer patterned to have an HBT emitter region and a JHEMT channel;

a HBT emitter contact and source and drain contacts on and interfused into said composite channel-emitter layer respectively adjacent said emitter region and on opposite sides of said channel;

a base-gate layer positioned above said composite channel-emitter layer, said base-gate layer patterned to have an HBT base mesa over said emitter region and a JHEMT gate pedestal over said channel;

base and gate contacts on a first portion of said base mesa and on said gate pedestal, respectively;

an HBT collector pedestal on a second portion of said base mesa;

a collector contact on said collector pedestal;

wherein said composite channel-emitter layer comprises:

an emitter-channel layer having a low band gap energy, said JHEMT source and drain contacts defining said channel in said emitter-channel layer;

an n-type sub-channel/emitter layer on one side of said emitter-channel layer, said sub-channel/emitter layer being doped to provide a low channel resistance and to reduce resistance between said emitter region and said HBT emitter contact and between said channel and said JHEMT source and drain contacts; and a composite modulation layer on the other side of said emitter-channel layer, said composite modulation layer supplying high mobility free electrons to said channel and spacing said free electrons away from the ionized donor atoms to reduce ionized impurity scattering, and having a high band gap energy that provides both a conduction band discontinuity and a valence band barrier at said channel;

said HBT emitter region, base mesa and collector pedestal forming a collector up vertical HBT and said JHEMT channel and gate pedestal forming a horizontal JHEMT.

7. The JHEMT-HBT MMIC of claim 6, wherein said emitter-channel layer is between said substrate and said composite modulation layer.

8. The JHEMT-HBT MMIC of claim 6, wherein said composite modulation layer is between said substrate and said emitter-channel layer.

9. The JHEMT-HBT MMIC of claim 6, wherein said emitter-channel layer has conduction and valence band energies that set its band gap energy, said composite modulation layer comprising:

a spacer layer on said emitter-channel layer to space the free electrons from the ionized donor atoms to reduce ionized impurity scattering in said channel;

an n-type donor layer on said spacer layer to supply the high mobility free electrons to said channel; and a barrier layer on said donor layer, said barrier layer having conduction and valence band energies that are respectively higher and lower than those of said emitter-channel layer to provide said conduction band discontinuity and said valence band barrier at said channel.

10. The JHEMT-HBT MMIC of claim 6, wherein said composite modulation layer includes a barrier layer that provides a large valence band barrier to limit hole injection into said channel.

11. The JHEMT-HBT MMIC of claim 6, further comprising:

an n-type etch stop layer on said composite emitter-channel layer; and a patterned n-type channel cap layer on said etch stop layer that supports said base mesa, said channel cap layer undercut to reduce a path for free electrons from said emitter region to said base contact, to improve emitter injection efficiency.

* * * * *